United States Patent
Chen

(10) Patent No.: US 9,350,380 B2
(45) Date of Patent: May 24, 2016

(54) SIGMA-DELTA MODULATOR AND ANALOG-TO-DIGITAL CONVERTER

(71) Applicant: INSTITUTE OF MICROELECTRONICS, CHINESE ACADEMY OF SCIENCES, Beijing (CN)

(72) Inventor: Lan Chen, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/425,095

(22) PCT Filed: Feb. 28, 2013

(86) PCT No.: PCT/CN2013/071961
§ 371 (c)(1),
(2) Date: Mar. 2, 2015

(87) PCT Pub. No.: WO2014/032717
PCT Pub. Date: Mar. 6, 2014

(65) Prior Publication Data
US 2015/0222289 A1 Aug. 6, 2015

(30) Foreign Application Priority Data
Sep. 3, 2012 (CN) .......................... 2012 1 0322266

(51) Int. Cl.
H03M 3/00 (2006.01)
H03M 1/00 (2006.01)

(52) U.S. Cl.
CPC .............. *H03M 3/324* (2013.01); *H03M 1/002* (2013.01); *H03M 3/38* (2013.01); *H03M 3/50* (2013.01); *H03M 3/424* (2013.01); *H03M 3/438* (2013.01)

(58) Field of Classification Search
None
See application file for complete search history.

(56) References Cited

U.S. PATENT DOCUMENTS 5,729,230 A 3/1998 Jensen
7,098,730 B1 * 8/2006 Shui ...................... H03M 3/386
341/143

(Continued)

FOREIGN PATENT DOCUMENTS

CN 101404503 4/2009
CN 101640539 2/2010

(Continued)

OTHER PUBLICATIONS

Durham et al. Circuit Architectures for High Linearity Monolithic Continuous-Time Filtering, IEEE Transactions on Circuits and Systems-11: Analog and Digital Signal Processing, vol. 39, No. 9, Sep. 1992.*

(Continued)

*Primary Examiner* — Howard Williams
(74) *Attorney, Agent, or Firm* — Goodwin Procter LLP

(57) ABSTRACT

A Sigma-Delta modulator and an analog-to-digital converter. The Sigma-Delta modulator comprises a quantizer, a correction module and an RC integrator. The correction module comprises a predetermined resistance through which a correction level is generated. The correction module is used to compare the correction level with a predetermined reference voltage by using a comparator in the quantizer, so as to generate a digital correction signal, based on which the resistance in a resistance correction array in the RC integrator is corrected. The predetermined resistance is of the same type as the resistance in the resistance correction array in the RC integrator. The Sigma-Delta modulator and the analog-to-digital converter can correct the resistance deviation in the RC integrator.

18 Claims, 4 Drawing Sheets

(56) References Cited

U.S. PATENT DOCUMENTS

| | | | |
|---|---|---|---|
| 7,221,302 B1 * | 5/2007 | Melanson | H03M 3/386 341/118 |
| 7,535,392 B2 | 5/2009 | Weng | |
| 7,944,378 B1 * | 5/2011 | Pesenti | H03M 3/382 341/118 |
| 8,581,764 B2 * | 11/2013 | Moue | H03M 3/386 341/143 |
| 9,160,356 B1 * | 10/2015 | Kearney | H03M 1/1009 |
| 2004/0183602 A1 * | 9/2004 | Maunuksela | H03C 3/0925 331/17 |
| 2009/0091484 A1 | 4/2009 | Weng | |

FOREIGN PATENT DOCUMENTS

| | | |
|---|---|---|
| CN | 102386929 | 3/2012 |
| CN | 102420614 | 4/2012 |
| CN | 102801424 | 11/2012 |

OTHER PUBLICATIONS

PCT/CN2013/071961 International Search Report (May 30, 2013).

PCT/CN2013/071961 Written Opinion (May 30, 2013).

\* cited by examiner

SIGMA-DELTA MODULATOR AND ANALOG-TO-DIGITAL CONVERTER

This application is a National Stage application of PCT International Application No. PCT/CN2013/071961, filed on Feb. 28, 2013, which claims priority to Chinese Patent Application No. 201210322266.9 titled "SIGMA-DELTA MODULATOR AND ANALOG-TO-DIGITAL CONVERTER" and filed with the Chinese State Intellectual Property Office on Sep. 3, 2012, which is incorporated herein by reference in its entirety.

FIELD

The present disclosure relates to the technical field of analog-to-digital converter, and in particular to a Sigma-Delta modulator and an analog-to-digital converter.

BACKGROUND

In recent years, the Sigma-Delta analog-to-digital converter is getting more and more attention due to its advantages such as high accuracy, high integration and low power consumption. There are two types of Sigma-Delta analog-to-digital converter, i.e., a continuous time type and a discrete time type, in view of the implementation of the integrator in the Sigma-Delta analog-to-digital converter. Compared with the discrete time Sigma-Delta analog-to-digital converter, the continuous time Sigma-Delta analog-to-digital converter has advantages of lower power consumption, higher speed and the inherent advantage of anti-aliasing. These advantages can efficiently extend the battery lifetime and decrease the complexity of the system, which are important to a portable wireless device. Therefore, the continuous time Sigma-Delta analog-to-digital converter is getting more and more attention recently. A Sigma-Delta modulator is a part of the Sigma-Delta analog-to-digital converter. The integrator is a basic and core module in the Sigma-Delta modulator. Two types of integrator, namely, a RC integrator and a Gm-C integrator are widely used in the Sigma-Delta modulator nowadays. The main advantage of the RC integrator compared with the Gm-C integrator is higher linearity and greater input signal amplitude. In addition, the characteristic of virtual ground of the RC integrator may allow the output of the feedback DAC to be connected to the virtual ground input end of the operational amplifier, so as to increase the linearity of the feedback DAC. Therefore, the RC integrator is more applicable to be applied in the case that requires high linearity and great swing of the input signal.

Because the resistance deviation due to processes is high, for example, 25%, the integral coefficient 1/RC of the RC integrator is deviated as the deviation of processes. The deviation of the integral coefficient may decrease the overall performance of the Sigma-Delta modulator, and even may disable the modulation function of the overall circuit or produce oscillations. Therefore, the resistance and (or) the capacitance should be corrected in designation to avoid the influence of the process deviation on the overall performance of the modulator.

In the conventional technology, the correction of the resistance in the RC integrator is mainly achieved by adding new components, which will increase loop delay, designation complexity, and further increase additional chip area, power consumption and cost.

SUMMARY

A technical problem to be solved by the present disclosure is to provide a Sigma-Delta modulator which is simply designed without increasing loop delay, additional chip area, power consumption and cost.

An embodiment of the present disclosure provides a Sigma-Delta modulator, including a quantizer, a correction module and an RC integrator.

The correction module includes a predetermined resistor through which a correction level is generated.

The correction module is configured to compare the correction level with a predetermined reference voltage by using a comparator in the quantizer, to generate a digital correction signal, and correct resistance of a resistance correction array in the RC integrator based on the digital correction signal, where the predetermined resistor is of the same type as resistors in the resistance correction array in the RC integrator.

Preferably, the Sigma-Delta modulator further includes a DAC and a D flip-flop, an input end of the D flip-flop is electrically connected to an output end of the comparator, an output end of the D flip-flop is connected to an input end of the DAC, and an output signal of the DAC is fed back to an input end of the RC integrator.

The D flip-flop synchronizes a comparison signal A between the RC integrator and the predetermined reference voltage, the synchronized comparison signal A is fed back to the input end of the RC integrator via the DAC as a part of input signal of the RC integrator;

The number of the DAC is less than or equal to the number of the RC integrator, an output end of one DAC is connected to an input end of at least one RC integrator, an output signal of the one DAC acts as a part of input signal of the at least one RC integrator; one RC integrator corresponds to at most an output of one DAC which acts as a part of input signal of the one RC integrator, and a first-stage RC integrator of the RC integrator is connected to an output end of one DAC, the output of the one DAC acts as a part of input of the first-stage RC integrator.

Preferably, the Sigma-Delta modulator further includes a feedforward resistor array, where one end of the feedforward resistor array is connected to an output end of a previous-stage circuit and the other end of the feedforward resistor array is connected to an input end of a next-stage circuit; the previous-stage circuit includes an RC integrator circuit or a circuit which provides an input to the first-stage RC integrator, the next-stage circuit includes an RC integrator circuit or a circuit which receives an output of a last-stage RC integrator, an output signal of the previous-stage circuit is fed forward to an input end of the next-stage circuit via the feedforward resistor array as a part of input signal of the next-stage circuit, and a resistance of the feedforward resistor array is selected by the digital correction signal.

Preferably, the correction module further includes a current source, a combinational logic circuit and a plurality of first pulse switches; one end of the predetermined resistor is connected to ground and the other end of the predetermined resistor is connected to the current source to generate the correction level at the other end of the predetermined resistor, one end of one of the first pulse switches is connected between the current source and the predetermined resistor, the other end of the first pulse switch is connected to a first input end of the comparator in the quantizer, the correction level is output to the first input end of the comparator via the first pulse switch when the first pulse switch is switched on; the predetermined reference voltage is output to a second input end of the comparator in the quantizer, the predetermined reference voltage is provided by a bias module.

The quantizer includes a plurality of comparators, an output end of each comparator is connected to an input end of the combinational logic circuit via one of the first pulse switches, a comparison result B between the correction level and the predetermined reference voltage is output to the input end of the combinational logic circuit when the one of the first pulse switches is switched on.

An output end of the combinational logic circuit is connected to the resistance correction array, the logic combinational circuit performs logical transformation on the comparing result B to restore signal sequence and outputs a digital correction signal with the number of bits the same as that of the comparator.

Preferably, the Sigma-Delta modulator further includes second pulse switches, where an output end of a last-stage RC integrator is connected to a first input end of the comparator in the quantizer via one of the second pulse switches, and an output signal of the last-stage RC integrator is output to the first input end of the comparator in the quantizer when the second pulse switch is switched on.

The output end of each comparator is connected to the input end of the D flip-flop via one of the second pulse switches, and the comparing result A between the output of the last-stage RC integrator and the predetermined reference voltage is output to the input end of the D flip-flop when the one of the second pulse switches is switched on.

Preferably, the resistance correction array includes a plurality of resistors connected in series which are a first resistor to an Nth resistor, where N is an integer; each of the first resistor to an (N−1)th resistor is connected with one switch in parallel, the number of the switches is equal to the number of bits of the digital correction signal, the switches are connected to outputs of the logic combinational circuit respectively in one-to-one correspondence; resistances of the first resistor to the (N−1)th resistor are a geometric sequence with a common ratio 2; the first resistor is connected to a previous-stage circuit, and the Nth resistor is connected to a next-stage circuit.

Each of the RC integrators includes two resistance correction arrays; one of the resistance correction arrays is connected in series with a non-inverting input end of an operational amplifier in the RC integrator; the other one of the resistance correction arrays is connected in series with an inverting input end of the operational amplifier in the RC integrator.

Preferably, the feedforward resistor array includes a plurality of resistors connected in series which are a first resistor to an Nth resistor, each of the first resistor to an (N−1)th resistor is connected with one switch in parallel, the number of the switches is equal to the number of bits of the digital correction signal, the switches are connected to inputs of the logic combinational circuit respectively in one-to-one correspondence; resistances of the first resistor to the (N−1)th resistor are a geometric sequence with a common ratio 2; one end of the first resistor is connected to a previous-stage circuit, and one end of the Nth resistor is connected to a next-stage circuit.

Preferably, the first pulse switches are controlled by a first clock signal, and the second pulse switches are controlled by a second clock signal.

When the modulator starts to operate, the first clock signal is in a high level, the corresponding first pulse switches are all switched on, and the second clock signal is in a low level, the corresponding second pulse switches are all switched off.

After the first clock signal is in the high level for a predetermined number of clock cycles, the first clock signal is in a low level, the corresponding first pulse switches are all switched off, and the second clock signal is in a high level, the corresponding second pulse switches are all switched on.

A Sigma-Delta analog-to-digital converter is further provided by an embodiment of the present disclosure, including the Sigma-Delta modulator.

The present disclosure has the following advantages compared with the conventional technology.

The Sigma-Delta modulator includes a quantizer, a correction module and an RC integrator. A correction module is added on the basis of the existing Sigma-Delta modulator according to the Sigma-Delta modulator provided by the embodiment of the present disclosure. The resistance correction array in the RC integrator is corrected by the correction module by using the existing comparators in the quantizer. As the predetermined resistor generating the correction level is of the same type as the resistor in the resistance correction array which is corrected, the process deviation of the predetermined resistor (process corner deviation of resistor) can accurately characterize the change of resistance of the resistor in the resistance correction array which is corrected. Similarly, the correction level at the predetermined resistor can also characterize the change of resistance of the resistor in the resistance correction array. With the present disclosure, it is not necessary to add too many additional components, and thus it is not necessary to increase more additional chip area, power consumption and cost.

DETAILED DESCRIPTION

Embodiments of the present disclosure will be described in detail below in conjunction with the drawings to make the above objects, features and advantages of the present disclosure clearer and easier to be understood.

Figure 1:
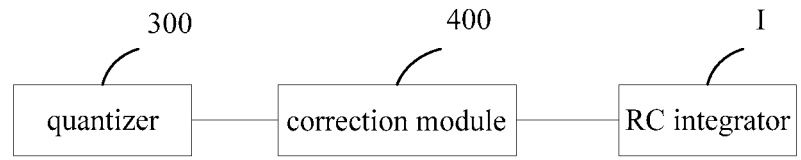
FIG. 1 is a schematic diagram of a first embodiment of a Sigma-Delta modulator according to the present disclosure.

Reference is made to FIG. 1, which is a schematic diagram of a first embodiment of a Sigma-Delta modulator according to the present disclosure.

The embodiment of the present disclosure provides a Sigma-Delta modulator, including a quantizer 300, a correction module 400 and an RC integrator I.

The correction module 400 includes a predetermined resistor through which a correction level is generated.

The correction module 400 is configured to compare the correction level with a predetermined reference voltage by using a comparator in the quantizer 300, to generate a digital correction signal, and correct resistance of a resistance correction array in the RC integrator I based on the digital correction signal, where the predetermined resistor is of the same type as resistors in the resistance correction array in the RC integrator I.

The correction module 400 is added on the basis of the existing Sigma-Delta modulator according to the Sigma- Delta modulator provided by the embodiment of the present disclosure. The resistance correction array in the RC integrator I is corrected by the correction module 400 by using the existing comparators in the quantizer 300. As the predetermined resistor generating the correction level is of the same type as the resistor in the resistance correction array which is corrected, the process deviation of the predetermined resistor (process corner deviation of resistor) can accurately characterize the change of resistance of the resistor in the resistance correction array which is corrected. Similarly, the correction level at the predetermined resistor can also characterize the change of the resistance of the resistor in the resistance correction array. With the present disclosure, it is not necessary to add too many additional components, and thus it is not necessary to increase more additional chip area, power consumption and cost.

Figure 2:
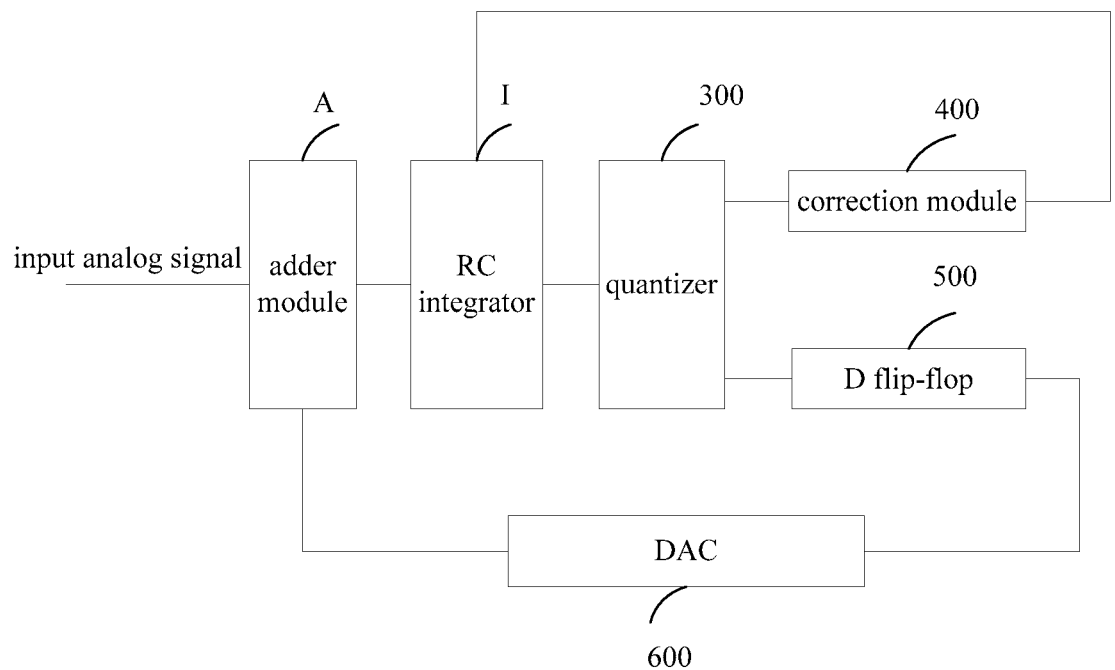
FIG. 2 is a schematic diagram of a second embodiment of a Sigma-Delta modulator according to the present disclosure.

Reference is made to FIG. 2, which is a schematic diagram of a second embodiment of a Sigma-Delta modulator according to the present disclosure.

The Sigma-Delta modulator provided by the embodiment further includes a DAC and a D flip-flop. An input end of the D flip-flop is electrically connected to an output end of the comparator, an output end of the D flip-flop is connected to an input end of the DAC, and an output signal of the DAC is fed back to an input end of the RC integrator.

The D flip-flop synchronizes a comparison signal A between the RC integrator and the predetermined reference voltage. The synchronized comparison signal A is fed back to the input end of the RC integrator via the DAC as a part of input signal of the RC integrator. The part of input signal of the RC integrator is added to other signals of the input end of the RC integrator to get the input of the RC integrator.

The number of the DAC is less than or equal to the number of the RC integrator, an output end of one DAC is connected to an input end of at least one RC integrator, an output signal of the one DAC acts as a part of input signal of the at least one RC integrator; one RC integrator corresponds to at most an output of one DAC which acts as a part of input signal of the one RC integrator, and a first-stage RC integrator of the RC integrator is connected to an output end of one DAC, the output of the one DAC acts as a part of input of the first-stage RC integrator.

It should be noted that the Sigma-Delta modulator may include multiple stages of RC integrators, and may include multiple DACs and adder modules accordingly. The adder module adds the part of input signal of the RC integrator to other signals input to the input end of the RC integrator, to get the input of the RC integrator. It can be understood that the Sigma-Delta modulator can be implemented with only one RC integrator, one DAC and one adder module in principle. In practice, the Sigma-Delta modulator generally includes at least two stages of RC integrators. The Sigma-Delta modulator illustrated in FIG. 2 only includes one RC integrator, one DAC and one adder module as an example.

The Sigma-Delta modulator provided by the embodiment of the present disclosure includes a quantizer 300, a correction module 400, a D flip-flop 500, at least one adder module A, at least one DAC 600 and at least one RC integrator I.

The adder module A is configured to superpose an analog signal input by a previous-stage circuit on an analog signal fed back by the DAC 600.

The RC integrator I is configured to integrate an analog signal output by the adder module A, where the RC integrator I includes a resistance correction array.

The quantizer 300 is configured to convert an analog signal generated by the RC integrator I into a digital signal. The quantizer 300 includes a comparator configured to compare the correction level generated at the predetermined resistor with a predetermined reference voltage to generate a comparison result.

The D flip-flop 500 is configured to synchronize a digital signal output by the quantizer with the clock and offset the delay of the digital signal caused by the quantizer.

The DAC 600 is configured to convert a digital signal output by the D flip-flop 500 into an analog signal and feedback the analog signal to the adder module A.

The correction module 400 is configured to generate a digital correction signal based on the comparison result, and correct the resistance of the resistance correction array in the RC integrator I based on the digital correction signal. The predetermined resistor is of the same type as resistors in the resistance correction array in the RC integrator I.

It should be noted that the RC integrator includes a resistance correction array, a capacitor and an operational amplifier. The capacitor and the resistor in the resistance correction array implement the function of integration. The non-inverting input end of the operational amplifier is connected to a resistance correction array, and the inverting input end of the operational amplifier is connected to a resistance correction array. A capacitor is connected between the non-inverting input end and the negative output end of the operational amplifier. A capacitor is connected between the inverting input end and the positive output end of the operational amplifier.

It should be noted that the Sigma-Delta modulator can operate with one RC integrator in view of the operational principle, but at least two RC integrators are employed in general application. It can be understood that the number of the RC integrators may be an integer greater than or equal to 2 in general application.

The following description is made by taking an example of a Sigma-Delta modulator including three RC integrators.

Figure 3:
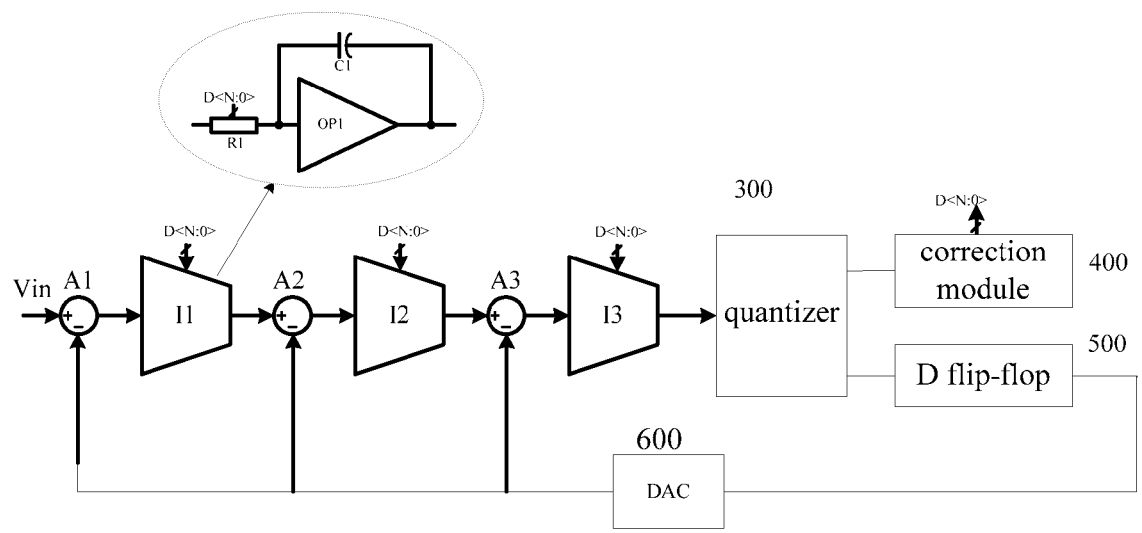
FIG. 3 is a schematic diagram of a third embodiment of a Sigma-Delta modulator according to the present disclosure.

Reference is made to FIG. 3, which is a schematic diagram of a third embodiment of a Sigma-Delta modulator according to the present disclosure.

It should be noted that the number of the DACs is less than or equal to the number of the RC integrators. If the number of the DACs is 1, the DAC is configured to convert the digital signal output by the D flip-flop into an analog signal and feedback the analog signal to the adder module in front of the first-stage RC integrator. The analog signal may also be fed back to the adder module in front of other stage RC integrator.

If the number of the DACs is greater than 1, one DAC is configured to convert the digital signal output by the D flip-flop into an analog signal and feedback the analog signal to the adder module in front of the first-stage RC integrator, other DAC is configured to convert the digital signal output by the D flip-flop into an analog signal and feedback the analog signal to the adder module in front of the corresponding stage of RC integrator.

It should be noted that the RC integrator which is located nearest to the input end of the modulator is the first-stage RC integrator.

For example, there are three RC integrators, and there may be one DAC for feeding back to the input end of the first-stage RC integrator or there may be two DACs for feeding back signals with one feeding back the signal to the first-stage RC integrator and the other feeding back the signal to the second-stage RC integrator or the third-stage RC integrator. In brief, there must be a DAC that feeds back a signal to the input end of the first-stage RC integrator, and other stage RC integrators may be or may not be provided with the DAC feedback signal. The number of the DACs is not necessarily equal to the number of the RC integrators.

It should be noted that the DAC in the Sigma-Delta modulator may feed back an analog signal for one RC integrator, or may feed back analog signals for part or all of the RC integrators. For example, in a case that the Sigma-Delta modulator includes three RC integrators, one adder module and one DAC, the DAC only feeds back an analog signal for the first-stage RC integrator. It can be understood that in a case that the Sigma-Delta modulator includes three RC integrators, three adder modules and one DAC, the DAC feeds back analog signals for all of the RC integrators. Similarly, for example, in a case that the Sigma-Delta modulator includes three RC integrators, two adder modules and two DACs, one DAC feeds back an analog signal for the first-stage RC integrator, and the other DAC feeds back an analog signal for the third-stage RC integrator. It can be understood that in a case that the Sigma-Delta modulator includes three RC integrators, three adder modules and three DACs, each DAC feeds back an analog signal for the corresponding RC integrator. As long as there is a DAC feeding back an analog signal to the corresponding RC integrator, an adder module in front of the RC integrator is required to execute an adding function.

In the embodiment illustrated in FIG. 3, there are three RC integrators in the Sigma-Delta modulator, i.e., a first-stage RC integrator I1, a second-stage RC integrator I2 and a third-stage RC integrator I3; there are three adder modules, i.e., a first-stage adder module A1, a second-stage adder module A2 and a third-stage adder module A3; and there is one DAC 600.

An input end of the first-stage adder module A1 is connected to an analog signal Vin input externally and an output signal of the DAC 600.

An output end of the first-stage adder module A1 is connected to an input end of the first-stage RC integrator I1.

An output end of the first-stage RC integrator I1 is connected to an input end of the second-stage adder module A2, and the input end of the second-stage adder module A2 is also connected to an output end of the DAC 600.

An output end of the second-stage adder module A2 is connected to an input end of the second-stage RC integrator I2.

An output end of the second-stage RC integrator I2 is connected to an input end of the third-stage adder module A3, and the input end of the third-stage adder module A3 is also connected to the output end of the DAC 600.

An output end of the third-stage adder module A3 is connected to an input end of the third-stage RC integrator I3.

An output end of the third-stage RC integrator I3 is connected to an input end of the quantizer 300.

An output end of the quantizer 300 is connected to the D flip-flop 500.

An output end of the D flip-flop 500 is connected to an input end of the DAC 600.

The N-bit digital correction signal output by the correction module 400 is output to the resistance correction array in each RC integrator, where N is an integer.

It should be noted that the RC integrator according to the embodiment of the present disclosure differs from the existing RC integrator in that the resistor is a resistance correction array, the resistance correction array may be an array in series connection, or may be an array in parallel connection, or may be an array in series-parallel connection.

The following description is made by taking an example that the resistance correction array in the embodiment of the present disclosure is an array in series connection.

The resistance correction array includes a plurality of resistors connected in series, i.e., a first resistor to an Nth resistor. Each of the first resistor to the (N−1)th resistor is connected with one switch in parallel. The number of the switches is equal to the number of bits of the digital correction signal. The switches are connected to the outputs of the logic combinational circuit respectively in one-to-one correspondence. The resistances of the first resistor to the (N−1)th resistor are a geometric sequence with a common ratio 2. One end of the first resistor is connected to a previous-stage circuit, and one end of the Nth resistor is connected to a next-stage circuit.

The resistance correction array is described by taking an example that N is an integer of 5 and the digital correction signal has 4 bits.

Figure 4:
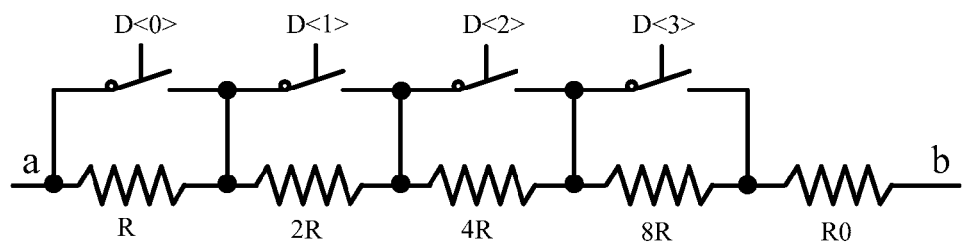
FIG. 4 is a schematic diagram of a resistance correction array/feedforward resistor array according to the present disclosure.

Reference is made to FIG. 4, which is a schematic diagram of a resistance correction array according to the present disclosure.

The resistance correction array includes a first resistor R, a second resistor 2R, a third resistor 4R, a fourth resistor 8R and a fifth resistor R0 connected in series.

Each of the first resistor R, the second resistor 2R, the third resistor 4R and the fourth resistor 8R is connected with one switch in parallel.

One end a of the first resistor R is the end that is not connected to the second resistor 2R. The other end b of the fifth resistor R0 is the end that is not connected to the fourth resistor 4R.

Each RC integrator includes two resistance correction arrays; one resistance correction array is connected in series with a non-inverting input end of an operational amplifier in the RC integrator; the other resistance correction array is connected in series with an inverting input end of the operational amplifier in the RC integrator.

The resistances of the fourth resistance 8R, the third resistance 4R and the second resistance 2R are eight times, four times and two times of the resistance of the first resistor R respectively. Such multiple relationship of the four resistances allows the externally represented resistance of the resistance correction array to jump from 1 times to 1.5 times of the resistance of the first resistor continuously. For example, if the resistance of the first resistor R is 1 k, the externally represented resistance of the resistance correction array may achieve a resistance of every integer times of 1 k, i.e., 1 k, 2 k, 3 k, 4 k, 5 k, 6 k, 7 k, 8 k, 9 k, 10 k, 11 k, 12 k, 13 k, 14 k, 15 k, by changing the status of the switches.

The switches in the resistance correction array are controlled by a 4-bit digital correction signal output by the correction module. The correction module will be described below.

It should be noted that in practice, the number of bits of the digital correction signal may be an integer greater than or equal to 1. The number of bits of the digital correction signal is equal to the number of the comparators in the quantizer.

The correction module further includes a current source, a combinational logic circuit and first pulse switches. One end of the predetermined resistor is connected to the ground and the other end of the predetermined resistor is connected to the current source, so as to generate a correction level at the other end of the predetermined resistor. One end of one of the first pulse switches is connected between the current source and the predetermined resistor, the other end of the first pulse switch is connected to a first input end of the comparator in the quantizer, the correction level is output to the first input end of the comparator via the first pulse switch when the first pulse switch is switched on. The predetermined reference voltage is output to a second input end of the comparator in the quantizer, the predetermined reference voltage is provided by a bias module.

The quantizer includes a plurality of comparators. The output end of each comparator is connected to an input end of the combinational logic circuit via one of the first pulse switches, and a comparison result B between the correction level and the predetermined reference voltage is output to the input end of the combinational logic circuit when the one of the first pulse switches is switched on.

An output end of the combinational logic circuit is connected to the resistance correction array. The logic combinational circuit performs logical transformation on the comparison result B to restore signal sequence and outputs a digital correction signal with the number of bits the same as that of the comparator.

The specific implementation of the correction module will be described below in conjunction with embodiments.

Figure 5:
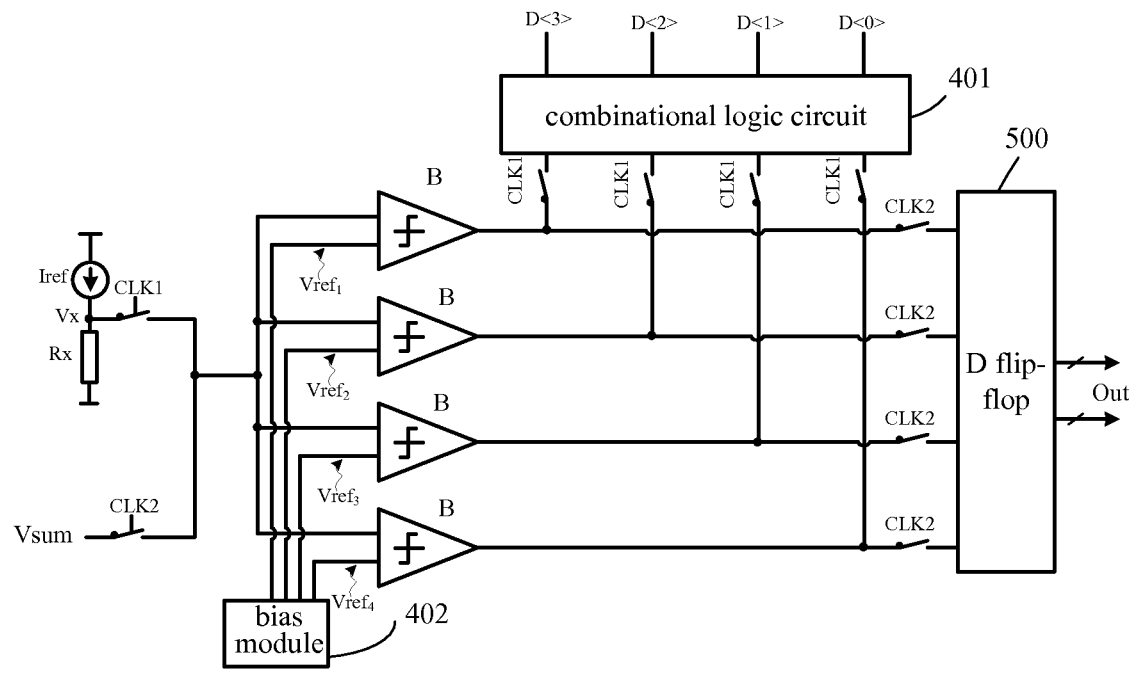
FIG. 5 is a schematic diagram of a correction module according to the present disclosure.

Reference is made to FIG. 5, which is a schematic diagram of a correction module according to the present disclosure.

The correction module includes a predetermined resistor Rx, a combinational logic circuit 401, five first pulse switches and five second pulse switches. The first pulse switches are controlled by a first clock signal CLK1, and the second pulse switches are controlled by a second clock signal CLK2.

The correction level Vx generated at the predetermined resistor Rx is connected to the first input ends of the four comparators B in the quantizer via one first pulse switch.

The summed signal Vsum is connected to the first input ends of the four comparators B in the quantizer via one second pulse switch.

The four predetermined reference voltages Vref1, Vref2, Vref3 and Vref4 are connected to the second input ends of the four comparators B in the quantizer respectively. The four predetermined reference voltages are generated by a bias module.

The output ends of the four comparators B are connected to the input ends of the combinational logic circuit 401 via the four first pulse switches respectively. The output ends of the four comparators B are connected to the input ends of the D flip-flop 500 via the four second pulse switches respectively.

The combinational logic circuit 401 outputs a 4-bit switch signal D<3>, D<2>, D<1> and D<0>, the 4-bit switch signal is the digital correction signal. The digital correction signal is used to control the four switches in the resistance correction array and/or the feedforward resistor array.

It should be noted that the combinational logic circuit 401 is composed of logic gates, and the function of the combinational logic circuit 401 is to perform logical combination on the input 4-bit digital signal to output a required 4-bit digital correction signal. For example, if the 4-bit digital signal input to the combinational logic circuit 401 is 1100 and the required 4-bit digital correction signal is 1010, the combinational logic circuit 401 needs to convert 1100 into 1010 by the logic gate circuit inside the combinational logic circuit.

It should be noted that the Sigma-Delta modulator may include a feedforward resistor array, or may not include a feedforward resistor array. The description of the embodiment of the present disclosure is made by taking an example that a feedforward resistor array is included.

One end of the feedforward resistor array is connected to an output end of a previous-stage circuit and the other end of the feedforward resistor array is connected to an input end of a next-stage circuit. The previous-stage circuit includes an RC integrator circuit or a circuit which provides an input to the first-stage RC integrator. The next-stage circuit includes an RC integrator circuit or a circuit which receives an output of a last-stage RC integrator. An output signal of the previous-stage circuit is fed forward to an input end of the next-stage circuit via the feedforward resistor array as a part of input signal of the next-stage circuit. The resistance of the feedforward resistor array is selected by the digital correction signal.

The structure of the feedforward resistor array is completely the same as the structure of the resistance correction array.

The feedforward resistor array includes a plurality of resistors connected in series, i.e., a first resistor to an Nth resistor. Each of the first resistor to the (N−1)th resistor is connected with one switch in parallel. The number of the switches is equal to the number of bits of the digital correction signal. The switches are connected to the inputs of the logic combinational circuit respectively in one-to-one correspondence. The resistances of the first resistor to the (N−1)th resistor are a geometric sequence with a common ratio 2. The first resistor is connected to a previous-stage circuit, and the Nth resistor is connected to a next-stage circuit. The previous-stage circuit and the next-stage circuit are distinguished by the overall flowing direction of the signal in the circuit, the circuit that the signal passes through earlier is the previous-stage circuit, and the circuit that the signal passes through later is the next-stage circuit.

The following description is made by taking an example that N is 5 in the feedforward resistor array.

Referring to FIG. 4, the feedforward resistor array includes a sixth resistance, a seventh resistance, an eighth resistance, a ninth resistance and a tenth resistance connected in series.

Each of the sixth resistance, the seventh resistance, the eighth resistance and the ninth resistance are connected with one switch in parallel.

The resistances of the ninth resistance, the eighth resistance and the seventh resistance are eight times, four times and two times of the resistance of the sixth resistance respectively.

It should be noted that the position of the sixth resistance, the seventh resistance, the eighth resistance, the ninth resistance and the tenth resistance of the feedforward resistors and the connection relationship therebetween are the same as those of the first resistor R, the second resistance 2R, the third resistance 4R, the fourth resistance 8R and the fifth resistance R0 in the resistance correction array, which will not be described in detail herein.

Figure 7:
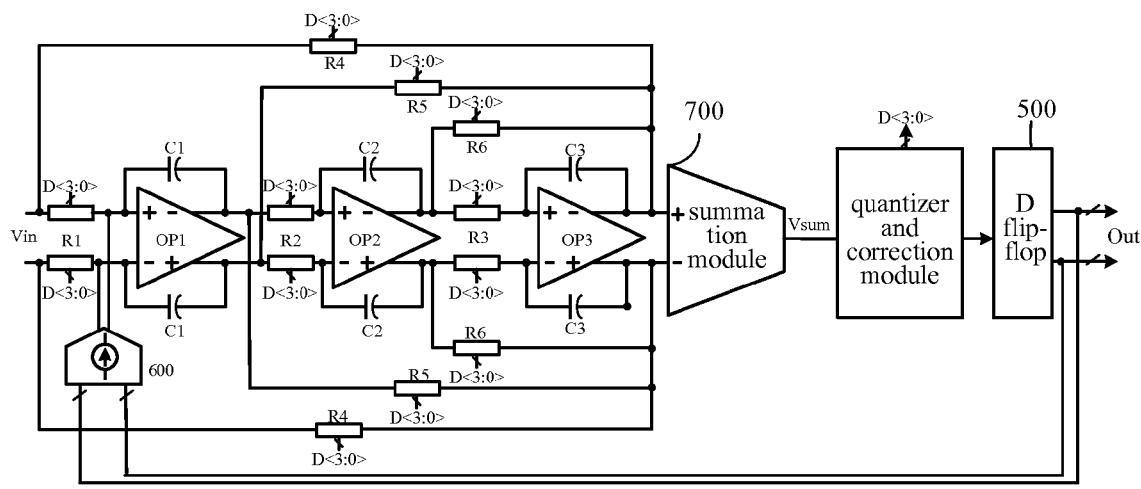
FIG. 7 is a schematic diagram of a fourth embodiment of a Sigma-Delta modulator according to the present disclosure.

The embodiment is illustrated in FIG. 7 in which the modulator includes three stages of RC integrators.

One feedforward resistor array is connected between the positive input end of the first-stage RC integrator (the output end of a previous-stage circuit of the first-stage RC integrator) and the negative output end of the third-stage RC integrator (the input end of a next-stage circuit of the last-stage RC integrator). One feedforward resistor array is connected between the negative input end of the first-stage RC integrator and the positive output end of the third-stage RC integrator.

One feedforward resistor array is connected between the positive input end of the second-stage RC integrator (the negative output end of the first-stage RC integrator) and the positive output end of the third-stage RC integrator. One feedforward resistor array is connected between the negative input end of the second-stage RC integrator (the positive output end of the first-stage RC integrator) and the negative output end of the third-stage RC integrator.

One feedforward resistor array is connected between the positive input end of the third-stage RC integrator (the negative output end of the second-stage RC integrator) and the negative output end of the third-stage RC integrator. One feedforward resistor array is connected between the negative input end of the third-stage RC integrator (the positive output end of the second-stage RC integrator) and the positive output end of the third-stage RC integrator.

In the embodiment of the present disclosure, only the connection mode of the feedforward resistor array for feeding forward to the output end of the last-stage RC integrator (the input end of a next-stage circuit of the last-stage RC integrator) is illustrated. The skilled in the art may understand that the feedforward resistor may also be used for feeding forward the output signal of a previous-stage circuit to the input of any stage of RC integrator, as long as the signal output by the previous-stage circuit and the input that fed forward to the next-stage circuit are of the same phase.

When the modulator starts to operate, the first clock signal CLK1 is in a high level, the corresponding first pulse switches are all switched on, and the second clock signal CLK2 is in a low level, the corresponding second pulse switches are all switched off. In this case, the 4-bit switch signal acts as an input of the resistance correction array in the RC integrator. The resistance array is corrected by controlling the resistance connected to the array, that is, by changing the externally represented resistance of the resistance correction array in FIG. 4.

After the first clock signal CLK1 is in the high level for a predetermined number of clock cycles, that is, after the correction is finished, the first clock signal CLK1 is in a low level, the corresponding first pulse switches are all switched off, and the second clock signal CLK2 is in a high level, the corresponding second pulse switches are all switched on. In this case, the Vsum in the modulator acts as an input of the comparator, the output end of the comparator is connected to the input end of the D flip-flop, and the modulator stars to operate.

Figure 6:
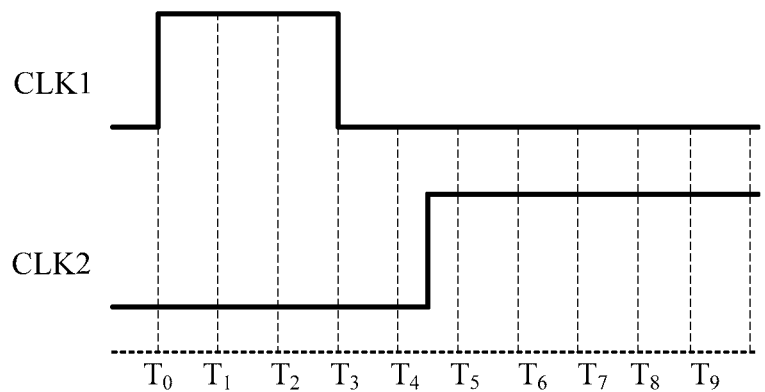
FIG. 6 is a timing diagram of a first clock signal and a second clock signal according to the present disclosure.

Referring to FIG. 6, which is a timing diagram of a first clock signal and a second clock signal according to the present disclosure.

When the Sigma-Delta modulator starts to operate, the first clock signal CLK1 is in a high level; the second clock signal CLK2 is in a low level. As illustrated in FIG. 6, CLK1 is in a high level during three clock cycles in the periods of time TO to T3, that is, the resistance in the RC integrator is corrected during the first three clock cycles.

After three clock cycles, the correction of the resistance is completed, CLK1 jumps to be in a low level, CLK2 jumps to be in a high level, and the Sigma-Delta modulator starts to operate normally. As illustrated in FIG. 6, CLK2 jumps to be in a high level between T4 and T4, and the Sigma-Delta modulator starts to operate normally after T5.

Reference is made to FIG. 7, which is a schematic diagram of a fourth embodiment of a Sigma-Delta modulator according to the present disclosure.

In the Sigma-Delta modulator provided by the embodiment, each RC integrator corresponds to one feedforward resistor array, and the feedforward resistor array is configured to feed forward all the input signal of the corresponding RC integrator to the output end of the last-stage RC integrator.

The output end of the last-stage RC integrator is connected to a summation module. The summation module is configured to sum up the output signal of the last-stage RC integrator and the signal fed forward by all the feedforward resistor arrays and output the summed signal to the quantizer.

As illustrated in FIG. 7, the feedforward resistor array of the first-stage RC integrator is R4, the feedforward resistor array of the second-stage RC integrator is R5, and the feedforward resistor array of the third-stage RC integrator is R6.

The modulator further includes a summation module 700 due to the existence of the feedforward resistor array.

The modulator according to the embodiment includes a DAC 600 configured to convert the digital signal output by the D flip-flop into an analog signal and feed back the analog signal to the adder module in front of the first-stage RC integrator.

R1 to R3 in the RC integrator form a resistance correction array, as schematically illustrated in FIG. 4. The specific implementation of the resistance correction module which performs a digital correction on the resistance correction array is illustrated in FIG. 5. A resistor Rx is of the same type as the resistance correction array R1 to R3 in the integrator. Therefore, the process deviation of Rx during the chip manufacturing can accurately characterize the change of the resistance of the resistance correction array R1 to R3 in the integrator. Similarly, a correction level Vx generated by a stable current source Iref flowing through the predetermined resistor Rx can also characterize the change of the resistance of the resistance correction array R1 to R3.

In the Sigma-Delta modulator, a quantizer is a necessary module. A quantizer is generally composed of one or more comparators.

With the Sigma-Delta modulator according to the present disclosure, the influence of the process corner change of resistor on the performance of the Sigma-Delta modulator is reduced, and no additional chip area is increased since the comparator in the Sigma-Delta modulator itself is utilized to correct the resistance. The resistance correction module according to the present disclosure completes adjustment during only the first several cycles after the modulator starts to operate, and the resistance correction module is in an off state from then on, so it does not consume any additional power and area. The resistance correction module is of high flexibility, the generated number of bits of the correction digital can be flexibly designed based on a compromise between adjustment accuracy and area.

The above mentioned are only preferred embodiments of the present disclosure, and are not intended to limit the present disclosure in any form. Although the preferred embodiments have been disclosed as above, it is not intended to limit the present disclosure. Many variations and modifications on the technical solution or the equivalent embodiments by modification are possible by anyone skilled in the art by using the method and technical content disclosed above without departing from the scope of the technical solution of the present disclosure. Therefore, all the contents that is not departing from the technical solution of the present disclosure and any simple modifications, equivalents and variations on the above embodiments on the basis of the technical essence of the present disclosure all belong to the protection scope of the technical solution of the present disclosure.

The invention claimed is:

1. A Sigma-Delta modulator, comprising a quantizer, a correction module and an RC integrator; wherein
    the correction module comprises a predetermined resistor through which a correction level is generated and a combinational logical circuit;
    the correction module is configured to compare the correction level with a predetermined reference voltage by inputting the correction level into a first input end of each comparator in the quantizer and inputting a predetermined reference voltage into a second input end of each comparator in the quantizer, to obtain a comparison result from an output end of each comparator in the quantizer; obtain a digital correction signal from an output end of the combinational logical circuit by inputting the comparison result into an input end of the combinational logical circuit which performs logical transformation on the comparison result to restore signal sequence; and correct resistance of a resistance correction array in the RC integrator by inputting the digital correction signal into the resistance correction array, wherein the predetermined resistor is of the same type as resistors in the resistance correction array in the RC integrator.

2. The Sigma-Delta modulator according to claim 1, wherein the Sigma-Delta modulator further comprises a DAC and a D flip-flop, an input end of the D flip-flop is electrically connected to an output end of the comparator, an output end of the D flip-flop is connected to an input end of the DAC, and an output signal of the DAC is fed back to an input end of the RC integrator; and wherein the D flip-flop is configured to synchronize a comparison signal A between the RC integrator and the predetermined reference voltage, the synchronized comparison signal A is fed back to the input end of the RC integrator via the DAC as a part of input signal of the RC integrator; the number of the DAC is less than or equal to the number of the RC integrator, an output end of one DAC is connected to an input end of at least one RC integrator, an output signal of the one DAC acts as a part of input signal of the at least one RC integrator; one RC integrator corresponds to at most an output of one DAC which acts as a part of input signal of the one RC integrator, and a first-stage RC integrator of the RC integrator is connected to an output end of one DAC, the output of the one DAC acts as a part of input of the first-stage RC integrator.

3. The Sigma-Delta modulator according to claim 2, further comprising a feedforward resistor array, wherein one end of the feedforward resistor array is connected to an output end of a previous-stage circuit and the other end of the feedforward resistor array is connected to an input end of a next-stage circuit; the previous-stage circuit comprises an RC integrator circuit or a circuit which provides an input to the first-stage RC integrator, the next-stage circuit comprises an RC integrator circuit or a circuit which receives an output of a last-stage RC integrator, an output signal of the previous-stage circuit is fed forward to an input end of the next-stage circuit via the feedforward resistor array as a part of input signal of the next-stage circuit, and a resistance of the feedforward resistor array is selected by the digital correction signal.

4. The Sigma-Delta modulator according to claim 2, wherein the correction module further comprises a current source and a plurality of first pulse switches; one end of the predetermined resistor is connected to ground and the other end of the predetermined resistor is connected to the current source to generate the correction level at the other end of the predetermined resistor, one end of one of the first pulse switches is connected between the current source and the predetermined resistor, the other end of the first pulse switch is connected to the first input end of the comparator in the quantizer, the correction level is output to the first input end of the comparator via the first pulse switch when the first pulse switch is switched on; the predetermined reference voltage is output to the second input end of the comparator in the quantizer, the predetermined reference voltage is provided by a bias module;

the quantizer comprises a plurality of comparators, the output end of each comparator is connected to the input end of the combinational logic circuit via one of the first pulse switches, the comparison result between the correction level and the predetermined reference voltage is output to the input end of the combinational logic circuit when the one of the first pulse switches is switched on; the output end of the combinational logic circuit is connected to the resistance correction array, and the combinational logic circuit outputs a digital correction signal with the number of bits the same as that of the comparator.

5. The Sigma-Delta modulator according to claim 1, further comprising a feedforward resistor array, wherein one end of the feedforward resistor array is connected to an output end of a previous-stage circuit and the other end of the feedforward resistor array is connected to an input end of a next-stage circuit; the previous-stage circuit comprises an RC integrator circuit or a circuit which provides an input to the first-stage RC integrator, the next-stage circuit comprises an RC integrator circuit or a circuit which receives an output of a last-stage RC integrator, an output signal of the previous-stage circuit is fed forward to an input end of the next-stage circuit via the feedforward resistor array as a part of input signal of the next-stage circuit, and a resistance of the feedforward resistor array is selected by the digital correction signal.

6. The Sigma-Delta modulator according to claim 5, wherein the feedforward resistor array comprises a plurality of resistors connected in series which are a first resistor to an Nth resistor, each of the first resistor to an (N−1)th resistor is connected with one switch in parallel, the number of the switches is equal to the number of bits of the digital correction signal, the switches are connected to inputs of the combinational logic circuit respectively in one-to-one correspondence; resistances of the first resistor to the (N−1)th resistor are a geometric sequence with a common ratio 2; one end of the first resistor is connected to a previous-stage circuit, and one end of the Nth resistor is connected to a next-stage circuit.

7. The Sigma-Delta modulator according to claim 1, wherein the correction module further comprises a current source and a plurality of first pulse switches; one end of the predetermined resistor is connected to ground and the other end of the predetermined resistor is connected to the current source to generate the correction level at the other end of the predetermined resistor, one end of one of the first pulse switches is connected between the current source and the predetermined resistor, the other end of the first pulse switch is connected to the first input end of the comparator in the quantizer, the correction level is output to the first input end of the comparator via the first pulse switch when the first pulse switch is switched on; the predetermined reference voltage is output to the second input end of the comparator in the quantizer, the predetermined reference voltage is provided by a bias module;

the quantizer comprises a plurality of comparators, the output end of each comparator is connected to the input end of the combinational logic circuit via one of the first pulse switches, the comparison result between the correction level and the predetermined reference voltage is output to the input end of the combinational logic circuit when the one of the first pulse switches is switched on; the output end of the combinational logic circuit is connected to the resistance correction array, and the combinational logic circuit outputs a digital correction signal with the number of bits the same as that of the comparator.

8. The Sigma-Delta modulator according to claim 7, further comprising second pulse switches, wherein an output end of a last-stage RC integrator is connected to a first input end of the comparator in the quantizer via one of the second pulse switches, and an output signal of the last-stage RC integrator is output to the first input end of the comparator in the quantizer when the second pulse switch is switched on, the output end of each comparator is connected to the input end of the D flip-flop via one of the second pulse switches, and the comparing result A between the output of the last-stage RC integrator and the predetermined reference voltage is output to the input end of the D flip-flop when the one of the second pulse switches is switched on.

9. The Sigma-Delta modulator according to claim 8, wherein the first pulse switches are controlled by a first clock signal, and the second pulse switches are controlled by a second clock signal;

when the modulator starts to operate, the first clock signal is in a high level, the corresponding first pulse switches are all switched on, and the second clock signal is in a low level, the corresponding second pulse switches are all switched off;

after the first clock signal is in the high level for a predetermined number of clock cycles, the first clock signal is in a low level, the corresponding first pulse switches are all switched off, and the second clock signal is in a high level, the corresponding second pulse switches are all switched on.

10. The Sigma-Delta modulator according to claim 7, wherein the resistance correction array comprises a plurality of resistors connected in series which are a first resistor to an Nth resistor, wherein N is an integer; each of the first resistor to an (N−1)th resistor is connected with one switch in parallel, the number of the switches is equal to the number of bits of the digital correction signal, the switches are connected to outputs of the-combinational logic circuit respectively in one-to-one correspondence; resistances of the first resistor to the (N−1)th resistor are a geometric sequence with a common ratio 2; the first resistor is connected to a previous-stage circuit, and the Nth resistor is connected to a next-stage circuit;

each of the RC integrators comprises two resistance correction arrays; one of the resistance correction arrays is connected in series with a non-inverting input end of a operational amplifier in the RC integrator; the other one of the resistance correction arrays is connected in series with an inverting input end of the operational amplifier in the RC integrator.

11. A Sigma-Delta analog-to-digital converter, comprising a Sigma-Delta modulator, wherein the Sigma-Delta modulator comprises a quantizer, a correction module and an RC integrator; wherein the correction module comprises a predetermined resistor through which a correction level is generated and a combinational logical circuit;

the correction module is configured to compare the correction level with a predetermined reference voltage by inputting the correction level into a first input end of each comparator in the quantizer and inputting a predetermined reference voltage into a second input end of each comparator in the quantizer, to obtain a comparison result from an output end of each comparator in the quantizer; obtain a digital correction signal from an output end of the combinational logical circuit by inputting the comparison result into an input end of the combinational logical circuit which performs logical transformation on the comparison result to restore signal sequence; and correct resistance of a resistance correction array in the RC integrator by inputting the digital correction signal into the resistance correction array, wherein the predetermined resistor is of the same type as resistors in the resistance correction array in the RC integrator.

12. The Sigma-Delta analog-to-digital converter according to claim 11, wherein the Sigma-Delta modulator further comprises a DAC and a D flip-flop, an input end of the D flip-flop is electrically connected to an output end of the comparator, an output end of the D flip-flop is connected to an input end of the DAC, and an output signal of the DAC is fed back to an input end of the RC integrator; and wherein the D flip-flop is configured to synchronize a comparison signal A between the RC integrator and the predetermined reference voltage, the synchronized comparison signal A is fed back to the input end of the RC integrator via the DAC as a part of input signal of the RC integrator;

the number of the DAC is less than or equal to the number of the RC integrator, an output end of one DAC is connected to an input end of at least one RC integrator, an output signal of the one DAC acts as a part of input signal of the at least one RC integrator; one RC integrator corresponds to at most an output of one DAC which acts as a part of input signal of the one RC integrator, and a first-stage RC integrator of the RC integrator is connected to an output end of one DAC, the output of the one DAC acts as a part of input of the first-stage RC integrator.

13. The Sigma-Delta analog-to-digital converter according to claim 11, further comprising a feedforward resistor array, wherein one end of the feedforward resistor array is connected to an output end of a previous-stage circuit and the other end of the feedforward resistor array is connected to an input end of a next-stage circuit; the previous-stage circuit comprises an RC integrator circuit or a circuit which provides an input to the first-stage RC integrator, the next-stage circuit comprises an RC integrator circuit or a circuit which receives an output of a last-stage RC integrator, an output signal of the previous-stage circuit is fed forward to an input end of the next-stage circuit via the feedforward resistor array as a part of input signal of the next-stage circuit, and a resistance of the feedforward resistor array is selected by the digital correction signal.

14. The Sigma-Delta analog-to-digital converter according to claim 13, wherein the feedforward resistor array comprises a plurality of resistors connected in series which are a first resistor to an Nth resistor, each of the first resistor to an (N−1)th resistor is connected with one switch in parallel, the number of the switches is equal to the number of bits of the digital correction signal, the switches are connected to inputs of the combinational logic circuit respectively in one-to-one correspondence; resistances of the first resistor to the (N−1)th resistor are a geometric sequence with a common ratio 2; one end of the first resistor is connected to a previous-stage circuit, and one end of the Nth resistor is connected to a next-stage circuit.

15. The Sigma-Delta analog-to-digital converter according to claim 11, wherein the correction module further comprises a current source and a plurality of first pulse switches; one end of the predetermined resistor is connected to ground and the other end of the predetermined resistor is connected to the current source to generate the correction level at the other end of the predetermined resistor, one end of one of the first pulse switches is connected between the current source and the predetermined resistor, the other end of the first pulse switch is connected to the first input end of the comparator in the quantizer, the correction level is output to the first input end of the comparator via the first pulse switch when the first pulse switch is switched on; the predetermined reference voltage is output to the second input end of the comparator in the quantizer, the predetermined reference voltage is provided by a bias module;

the quantizer comprises a plurality of comparators, the output end of each comparator is connected to the input end of the combinational logic circuit via one of the first pulse switches, the comparison result between the correction level and the predetermined reference voltage is output to the input end of the combinational logic circuit when the one of the first pulse switches is switched on;

the output end of the combinational logic circuit is connected to the resistance correction array, and the combinational logic circuit outputs a digital correction signal with the number of bits the same as that of the comparator.

16. The Sigma-Delta analog-to-digital converter according to claim 15, further comprising second pulse switches, wherein an output end of a last-stage RC integrator is connected to a first input end of the comparator in the quantizer via one of the second pulse switches, and an output signal of the last-stage RC integrator is output to the first input end of the comparator in the quantizer when the second pulse switch is switched on, the output end of each comparator is connected to the input end of the D flip-flop via one of the second pulse switches, and the comparing result A between the output of the last-stage RC integrator and the predetermined reference voltage is output to the input end of the D flip-flop when the one of the second pulse switches is switched on.

17. The Sigma-Delta analog-to-digital converter according to claim 16, wherein the first pulse switches are controlled by a first clock signal, and the second pulse switches are controlled by a second clock signal;

when the modulator starts to operate, the first clock signal is in a high level, the corresponding first pulse switches are all switched on, and the second clock signal is in a low level, the corresponding second pulse switches are all switched off;

after the first clock signal is in the high level for a predetermined number of clock cycles, the first clock signal is in a low level, the corresponding first pulse switches are all switched off, and the second clock signal is in a high level, the corresponding second pulse switches are all switched on.

18. The Sigma-Delta analog-to-digital converter according to claim 15, wherein the resistance correction array comprises a plurality of resistors connected in series which are a first resistor to an Nth resistor, wherein N is an integer; each of the first resistor to an (N−1)th resistor is connected with one switch in parallel, the number of the switches is equal to the number of bits of the digital correction signal, the switches are connected to outputs of the combinational logic circuit respectively in one-to-one correspondence; resistances of the first resistor to the (N−1)th resistor are a geometric sequence with a common ratio 2; the first resistor is connected to a previous-stage circuit, and the Nth resistor is connected to a next-stage circuit;

each of the RC integrators comprises two resistance correction arrays; one of the resistance correction arrays is connected in series with a non-inverting input end of a operational amplifier in the RC integrator; the other one of the resistance correction arrays is connected in series with an inverting input end of the operational amplifier in the RC integrator.

\* \* \* \* \*